(12) United States Patent
Ishida et al.

(10) Patent No.: US 6,775,198 B2
(45) Date of Patent: Aug. 10, 2004

(54) SEMICONDUCTOR STORAGE UNIT

(75) Inventors: Kozo Ishida, Tokyo (JP); Hideki Yonetani, Tokyo (JP); Takeshi Ohgami, Tokyo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 132 days.

(21) Appl. No.: 10/253,512

(22) Filed: Sep. 25, 2002

(65) Prior Publication Data

US 2003/0058726 A1 Mar. 27, 2003

(30) Foreign Application Priority Data

Sep. 25, 2001  (JP) ...................................... 2001-291647

(51) Int. Cl.$^7$ ................................................. G11C 7/00
(52) U.S. Cl. ..................... 365/226; 365/63; 365/230.03
(58) Field of Search ....................... 365/226, 63, 230.03

(56) References Cited

U.S. PATENT DOCUMENTS

| | | | |
|---|---|---|---|
| 5,838,627 A | * 11/1998 | Tomishima et al. .... | 365/230.03 |
| 6,021,080 A | * 2/2000 | Miyano ...................... | 365/226 |
| 6,064,621 A | 5/2000 | Tanizaki et al. | |
| 6,195,306 B1 | * 2/2001 | Horiguchi et al. .......... | 365/226 |
| 6,222,781 B1 | * 4/2001 | Matsumoto et al. ... | 365/189.09 |

FOREIGN PATENT DOCUMENTS

JP   11-203862   7/1999

* cited by examiner

*Primary Examiner*—Hoai Ho
(74) *Attorney, Agent, or Firm*—McDermott Will & Emery LLP

(57) ABSTRACT

Power to operates memory bank of DRAM stably is supplied with reduced power consumption. A semiconductor storage unit includes multiple arrays forming memory banks on a substrate, first and second power supplies. Multiple arrays are arranged like a matrix and surround the central region of the substrate. Each memory bank consists of two of the multiple arrays. Each first power supply supplies driving power to a peripheral circuit which drives each multiple array. Second power supplies are arranged at four corners of the central region, each supply provides access power to word lines which access the multiple arrays. The first power supplies are mounted to a central and the opposite side for predetermined arrays, serve as a main and an auxiliary power supply to provide main and auxiliary power (smaller than the main power), and provide distantly arranged two of the multiple arrays forming a memory bank with power.

7 Claims, 7 Drawing Sheets

SEMICONDUCTOR STORAGE UNIT

BACKGROUND OF THE INVENTION

1. Field of the Invention

The present invention relates to a semiconductor storage unit, and more specifically, to a control of power supply for driving a dynamic random access memory.

2. Description of the Background Art

FIG. 1 is a block diagram showing a configuration of a conventional dynamic random access memory (hereinafter referred to as "DRAM") chip 70. The conventional DRAM chip 70 has memory banks A, B, C, and D arranged in areas obtained by dividing a rectangular semiconductor chip into 4 portions. Each of memory banks A through D has, for example, 16M-bit storage capacity, and further includes a line address decoder which selects lines of the bank, column address decoder which selects columns, and a sense amplifier which detects and amplifies data of memory cell selected (none of them is illustrated).

Furthermore, DRAM chip 70 has two kinds of power supply circuit which drives each of memory banks A through D. That is, peripheral power supply circuits VDC71, 72, 73, and bank power supply circuits for VPP74, 75. Peripheral power supply circuits VDC71, 72, 73 supply power (that is, current and line voltage) to peripheral circuits and one or more sense amplifiers. On the other hand, bank power supply circuits for VPP74 and 75 apply the power (that is, current and step-up voltage VPP) to word lines selected. All of the power supply circuits are installed at central regions defined between a row of memory banks A and C of DRAM chip 70 and a row of memory banks B and D. One of the reasons why a power supply circuit is arranged at the central region is that lengths of power supply lines which apply line voltage to memory banks A through D are brought to be nearly equal.

When memory cell selecting operations are carried out simultaneously in memory banks A through D, peripheral power supply circuit VDC must supply electric power to sense amplifiers included in memory banks A through D. That is, a drive transistor of peripheral power supply circuit VDC which supplies current and voltage to a sense amplifier needs to have a large current driving power. Consequently, size (channel width) of drive transistor must be made sufficiently large. However, since the current flows through a drive transistor which has a large channel width when a sense amplifier is in operation, it is unable to reduce direct current, and as a result, current consumption of DRAM chip 70 increases.

In addition, peripheral power supply circuits VDC71, 72, 73 are not arranged at positions completely at equal distances from memory banks A through D. Consequently, impedance of power supply line differs due to the difference of the length of power line and the drop rate of line voltage supplied to the power supply line also differs. When the power supply capability of peripheral power supply circuits VDC71, 72, 73 is decided with voltage drop in the power supply line with small impedance, still greater voltage drop occurs in the sense power supply line with large impedance, and accurate sense operation is unable to be carried out. On the other hand, when the current driving force of peripheral power supply circuits VDC71, 72, 73 is decided with voltage drop in the power supply line with large impedance, unnecessarily large current is supplied to the sense power supply line with small impedance, and current is consumed. That is, because of unbalance of impedance in the power supply line, stable operation of DRAM chip 70 is unable to be secured.

SUMMARY OF THE INVENTION

It is an object of the present invention to supply electric power that enables each memory bank to stably operate and at the same time to reduce consumption power.

A semiconductor storage unit according to the present invention has multiple arrays that form memory banks on a substrate, each of the memory banks consisting of two of the multiple arrays; first power supplies, each of which supplies driving power to a peripheral circuit which drives each of the multiple arrays; and second power supplies, each of which supplies access power to word lines which access the multiple arrays. Multiple arrays are arranged in the form of a matrix and surround the central region of the substrate. The first power supplies are mounted to a central region side and to an opposite side of the central region side for predetermined arrays. The second power supplies are arranged at four corners of the central region. The first power supplies serve as a main power supply to provide main power and as an auxiliary power supply to provide auxiliary power, smaller than the main power, and provide distantly arranged two of the multiple arrays forming a memory bank with power. According to this configuration, even for memory bank arrays which are arranged distantly, sufficient electric power can be applied with voltage drop avoided.

BRIEF DESCRIPTION OF THE DRAWINGS

These and other object and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
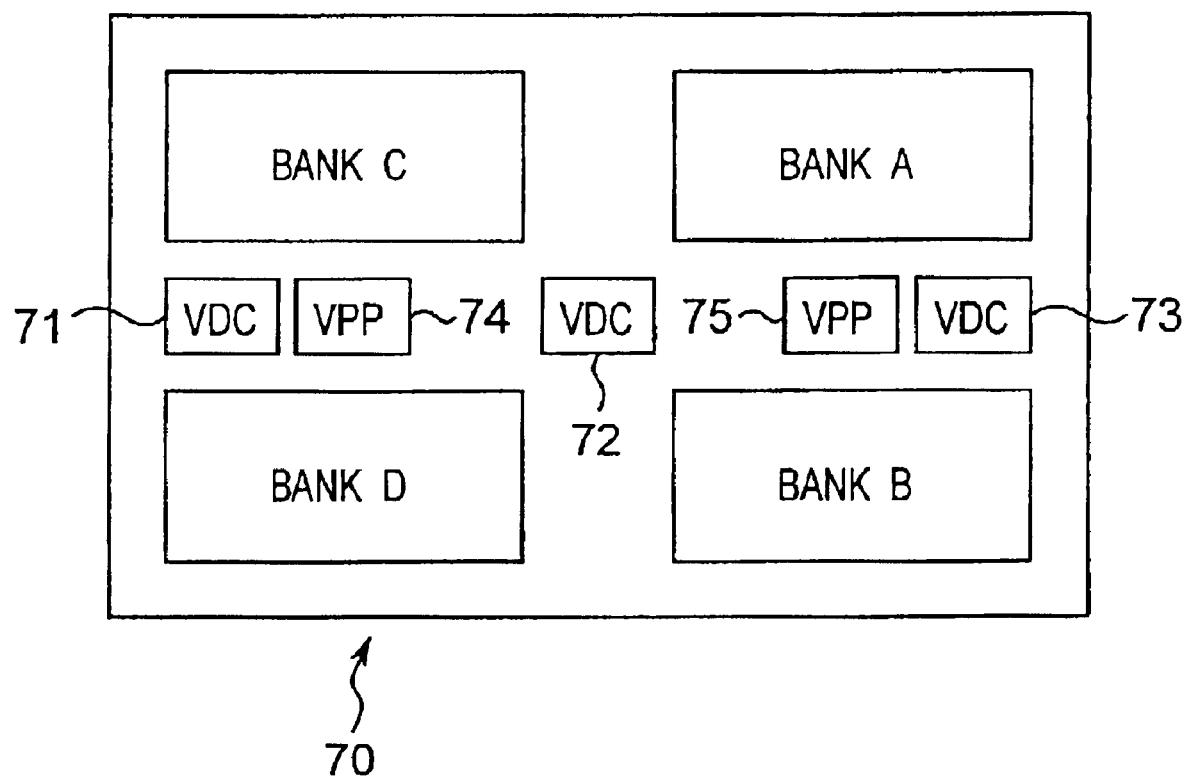
FIG. 1 is a block diagram of a conventional dynamic random access memory chip.
Figure 2:
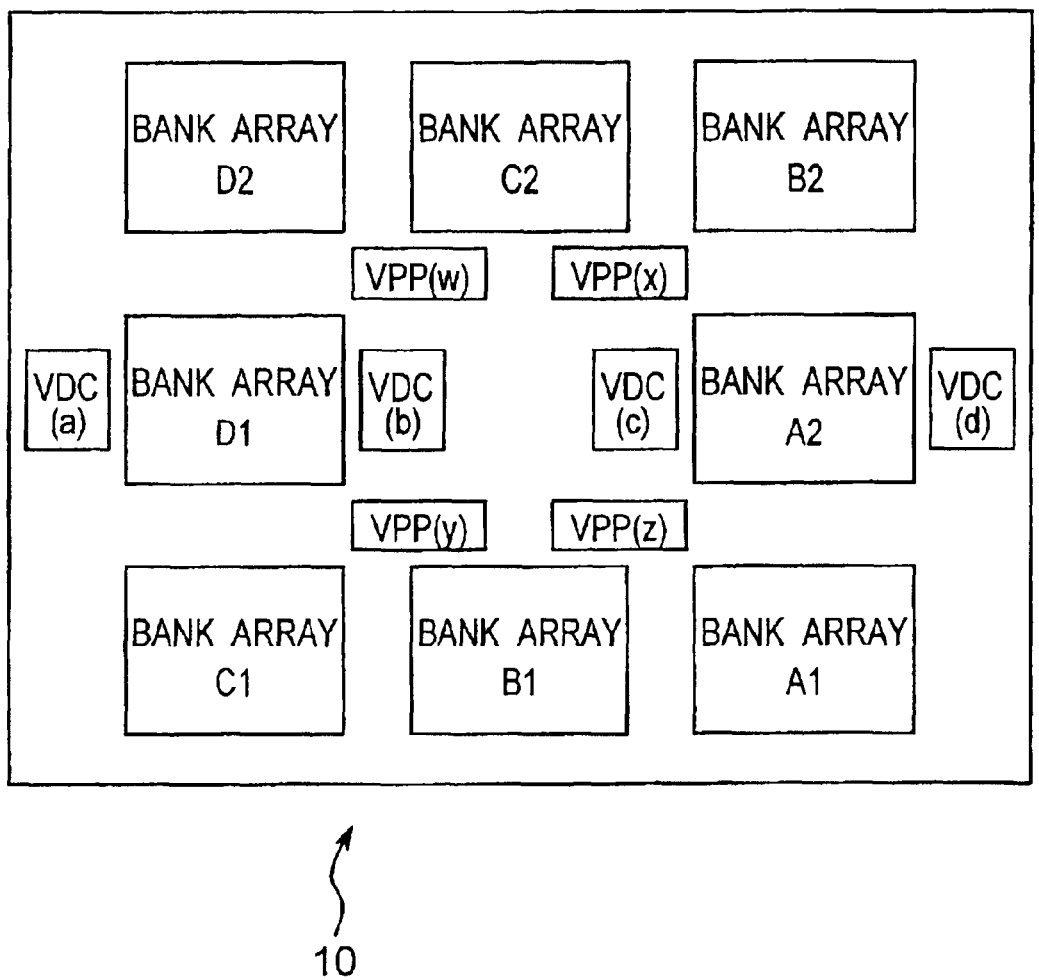
FIG. 2 is a block diagram of a dynamic random access memory chip according to the present embodiment.

FIG. 2 is a block diagram showing a configuration of dynamic random access memory (hereinafter referred to as "DRAM") chip 10 according to the present embodiment. DRAM chip 10 has eight memory bank arrays A1, A2, B1, B2, C1, C2, D1, D2 and two kinds of power supply circuit for driving each of the eight memory bank arrays, that is, four peripheral power supply circuits VDC (a), (b), (c), (d) as well as four bank power supply circuits VPP (w), (x), (y), (z). In addition, DRAM chip 10 further includes power supply lines which supplies power from power supply circuits to each memory bank array, signal line such as word lines for accessing each memory bank array (all not illustrated), etc.

First of all, the memory bank array will be described. Eight memory bank arrays are arranged in the form of a matrix and surround the central region of DRAM chip 10. Specifically, memory bank array A1 is located on the lower right of DRAM chip 10 and then, successively clockwise arrays B1, C1, D1, D2, C2, B2, and A2 are located in that order. Each of bank array A1 and A2 is also called "memory array block" and two arrays form one memory bank. In the following description, "memory bank A" means two memory bank arrays A1 and A2. The same applies to all the combinations of other memory bank arrays. Each of memory bank array contains a plurality of memory cells.

Next discussion will be made on the power supply circuit. Four peripheral power supply circuits VDC (a), (b), (c), (d) supply power (that is, current and line voltage) to peripheral circuits to drive DRAM chip 10. Each of, or at least one of the peripheral circuits contain a sense amplifier. Peripheral power supply circuits VDC (b), (c) are arranged in the central region of DRAM chip 10 and peripheral power supply circuits VDC (a), (d) are arranged in the peripheral sections of DRAM chip 10. Peripheral power supply circuits VDC (a) and (b) are arranged with bank D1 held between. Peripheral power supply circuits VDC (c) and (d) are arranged with bank A2 held between. Four bank power supply circuits VPP (w), (x), (y), (z) apply electric power (that is, current and step-up voltage VPP) to a selected word line of memory bank arrays. Bank power supply circuits VPP (w), (x), (y), (z) are installed at four corners of the central region of DRAM chip 10, and VPP (w), VPP (x), VPP (z), VPP (y) are arranged in that order clockwise from the left top corner of the central region.

In addition, at the central region, not only power supply circuits but also a DRAM control circuit (not illustrated) is formed. In the following description, the power supply circuits and the DRAM control circuit are generically called the control circuit. The control circuit controls activity/non-activity of eight memory bank arrays and also controls data access. Activity/non-activity shows the condition in which the word line is driven to the selective condition in memory bank arrays. Each one of eight memory bank arrays has multiple memory cells arranged in the form of a matrix.

By dividing DRAM chip 70 into small regions of multiple lines and multiple columns (3-line 3-column) in this way, it is possible to secure a control circuit forming region of an area practically the same as each memory bank array arranged region. Consequently, the control circuit can be arranged with flexibility. By arranging the power supply circuit in the central region, line voltage can be supplied at the minimum wiring length. In addition, influences of voltage drop caused by power supply line impedance can also be sufficiently suppressed. In the same manner, arranging eight memory bank arrays as if they surround the control circuit at the central region can minimize the wiring distance from control circuit to each memory bank array. Consequently, it is possible to reduce delay in signal transmission.

A primary feature of the present invention lie in power supply control of DRAM chip 10. To describe specifically, when memory bank A is activated, peripheral power supply circuits VDC (c), (d) are activated as main power supplies of peripheral circuits related to motions of memory bank arrays A1, A2. In addition, for main power supply for driving word lines of memory bank arrays A1, A2, bank power supply VPP (z) are activated.

On the other hand, when memory bank B is activated, peripheral power supply circuits VDC (c), (d) are activated as main power supplies for supplying main power and further, peripheral power supply circuit VDC (b) is activated as an auxiliary power supply for supplying auxiliary electric power smaller than the main power supply. The reason for providing peripheral power supply circuit VDC (b) as the auxiliary power supply is because there are cases in which electric power enough to drive memory bank array B1 is unable to be supplied due to voltage drop with peripheral power supply circuit VDC (c) alone. In addition, for the main power supply for driving word lines of memory bank arrays B1, B2, bank power supply circuits VPP (x), (y) are activated.

Now, the electric power which each of bank power supply circuits VPP (x), (y) supply is smaller than the electric power which bank power supply VPP (z) supplies as the main power supply for driving word lines of memory bank arrays A1, A2. Accordingly, as compared to the case in which the same electric power is constantly supplied, the consumption rate of electric power which bank power supply circuits VPP (x), (y) supply can be reduced. By the way, the control of memory bank D is same as memory bank A and the control of memory bank C is same as memory bank B.

Supplying auxiliary electric power by providing the auxiliary power supply in this way can avoid voltage drop of memory bank (in this case, memory banks B, C) where memory bank arrays are arranged in distant positions and can supply sufficient line voltage.

Figure 3:
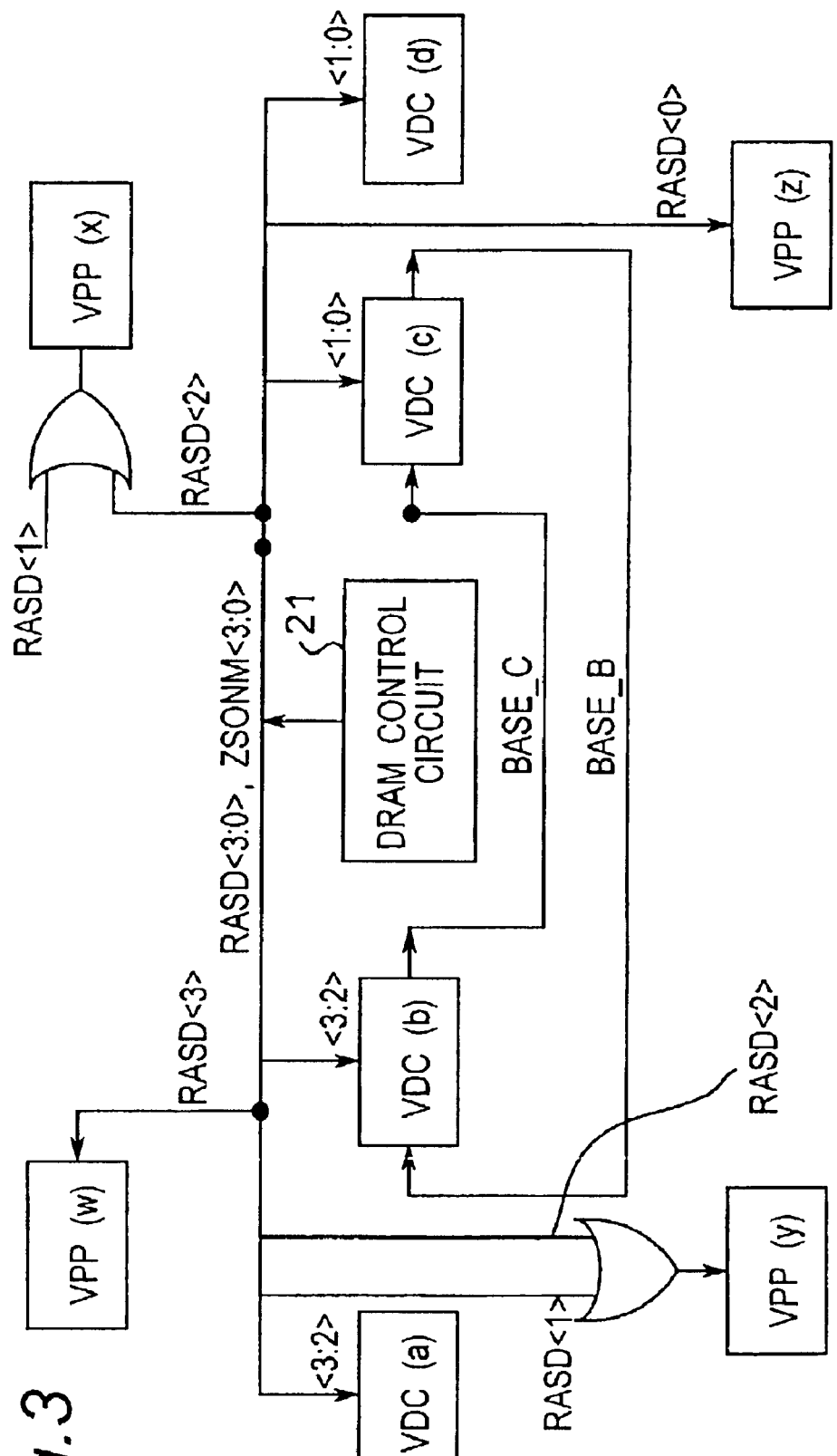
FIG. 3 is a signal chart of power supply activating control of DRAM chip.

Now, description is made on the configuration and motions of DRAM chip 10 that can materialize above-mentioned features of the present invention. FIG. 3 is a signal chart of power supply activating control of DRAM chip 10 (FIG. 2). In FIG. 3, for example, notation RASD <3:0> indicates that four signal liens (third, second, first, and 0th bits) exist in control signal line RASD. Simply indicating <3:2> means that third bit to second bit signal lines are used. Notation <n> indicates that the nth-bit signal line is used.

First of all, DRAM control circuit 21 activates the specified memory bank, and then, activates the power supply circuit that supplies electric power to the memory bank. This is achieved by DRAM control circuit 21 which causes appropriate bit lines of two kinds of control signals RASD, ZSONM to high level or low level. The two kinds of control signals RASD, ZSONM are control signals that activate peripheral power supply circuits VDC (a) through (d) as main power supply.

Furthermore, for activation of power supply circuit, two kinds of signals of control signals BASE_B, and BASE_C are used. Control signals BASE_B, C control peripheral power supply circuits VDC (c), (d). More specifically, for control signals BASE_B, C become activating signals as auxiliary power supply for peripheral power supply circuits VDC (c), (d). As described later, control signals BASE_B, C are created based on control signals RASD<3:0>, ZSONM<3:0>. The reason why signal lines of control signal for activation as auxiliary power supply is not provided from DRAM control circuit 21 to each of peripheral power supply circuits VDC (c), (d) is to reduce the number of signal wires.

This can be explained using examples. First of all, cases in which memory bank A is activated are considered. DRAM control circuit 21 brings control signal RASD<0> to the high level and ZSONM<0> to the low level. Then, peripheral power supply circuits VDC (c), (d) are activated. In such event, by control signal RASD<0>, bank power supply circuit VPP (z) is also activated.

For the next example, the case when memory bank B is activated is considered. DRAM control circuit 21 brings control signal RASD<1> to the high level and ZSONM<1> to the low level. As a result, peripheral power supply circuits VDC (c), (d) are activated. Peripheral power supply circuit VDC (c) generates control signal BASE_B to operate peripheral power supply circuit VDC (b) as auxiliary power supply. Peripheral power supply circuit VDC (b) serves as an auxiliary power supply based on control signal BASE_B. In addition, by control signal RASD<1>, bank power supplied VPP (x), (y) are activated.

Figure 4:
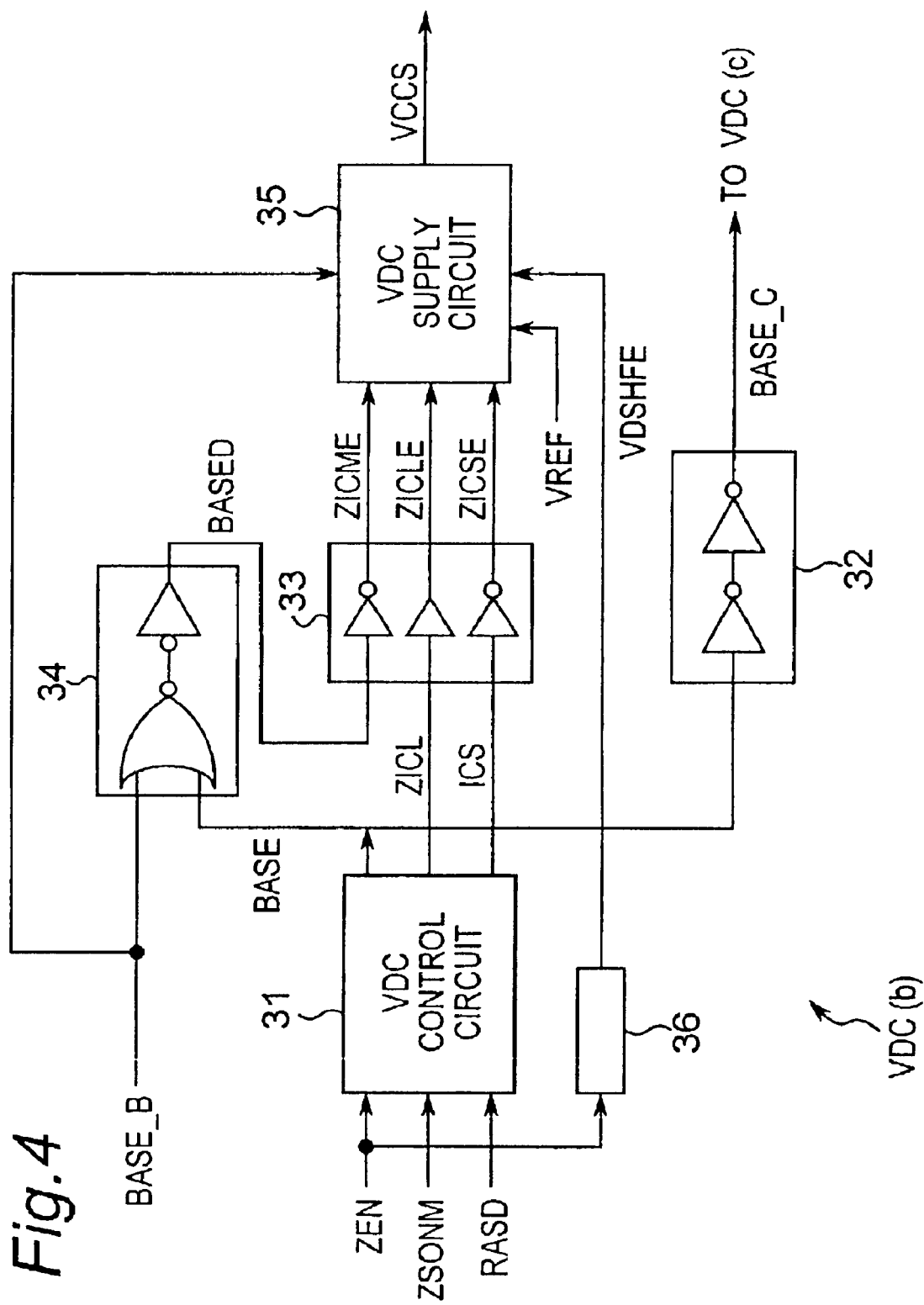
FIG. 4 is a block diagram of a peripheral power supply circuit VDC (b)

Now, the configuration of peripheral power supply circuit VDC will be described. To be more specific, the description will be made with peripheral power supply circuit VDC (b) taken as an example. FIG. 4 is a block diagram showing the configuration of peripheral power supply circuit VDC (b). Peripheral power supply circuit VDC (b) primarily comprises VDC control circuit 31, control signal generating section 32, reversing circuit 33, internal control signal generating section 34, VDC supply circuit 35, and level shift signal generating section 36.

Figure 5A:
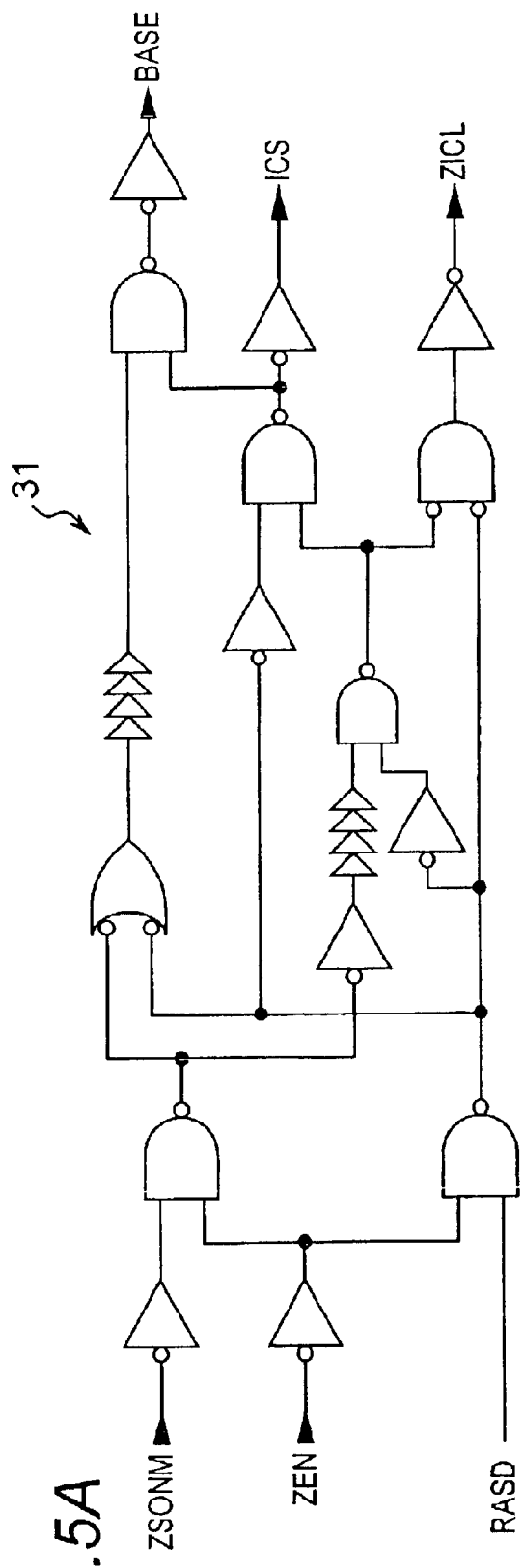
FIG. 5A and FIG. 5B are diagrams of specific configuration and operation of a VDC control circuit.
Figure 5B:
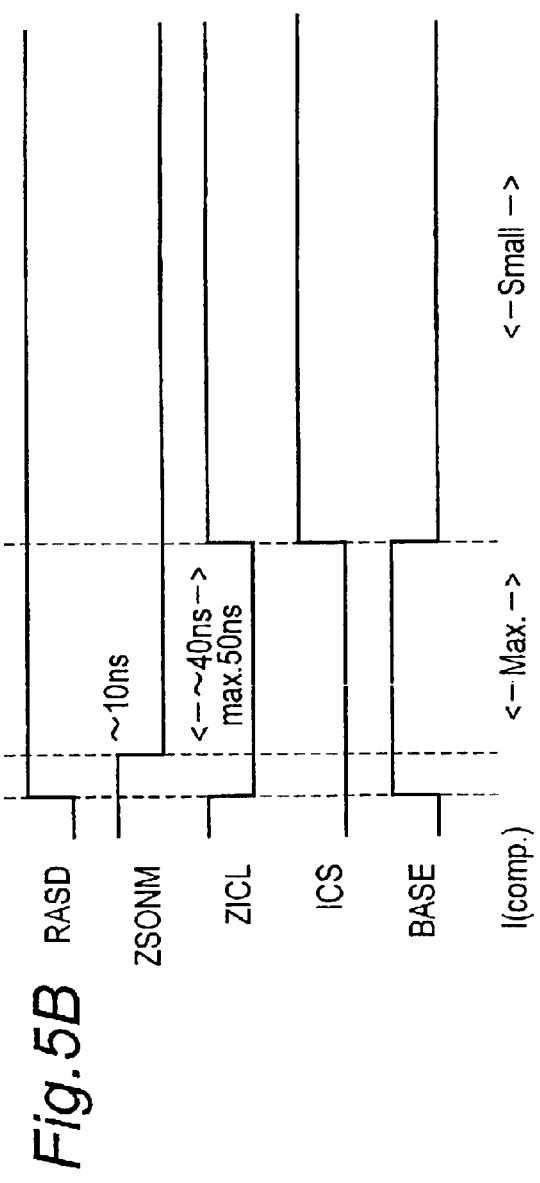

First of all, movements when peripheral power supply circuit VDC (b) serves as main power supply are described. This is, for example, a case in which memory bank C (memory bank arrays C1, C2) is activated. First of all, control signals RASD <2>, ZSONM <2>, and ZEN are entered VDC control circuit 31. Control signals RASD <2> and ZSONM <2> are of high level and of low level, respectively. FIG. 5A and FIG. 5B are diagrams showing the specific configuration and motions of VDC control circuit 31. That is, FIG. 5A is a circuit diagram of VDC control circuit 31, and FIG. 5B is a timing chart showing input signal and output signal.

Referring again to FIG. 4, VDC control circuit 31 outputs internal control signal BASE, ZICL, and ICS. Internal control signal BASE is entered in internal control signal generating section 34 together with control signal BASE_B from peripheral power supply circuit VDC (c) (FIG. 3). When peripheral power supply circuit VDC (b) becomes a main power supply, control signal BASE_B is of low level and control signal BASE becomes low level after it becomes 40 ns high level. Consequently, internal control signal generating section 34 outputs signal BASED which becomes low level after it becomes 40 ns high level. Signal BASED is entered into reversing circuit 33 and VDC supply circuit 35. VDC supply circuit 35 supplies the specified power VCCS as main power supply by the control of control signals ZICME, ZICLE, ZICSE after VDC supply circuit 35 receives signal BASED.

Next description will be made on motions when peripheral power supply circuit VDC (b) becomes an auxiliary power supply. This is the case in which, for example, memory bank B (memory bank arrays B1, B2) (FIG. 2) are activated. First of all, control signals RASD <2>, ZSONM <2>, ZEN are entered. Control signals RASD <2> and ZSONM <2> are of high level and of low level, respectively. VDC control circuit 31 outputs internal control signals BASE, ZICL, and ICS. Internal control signal BASE is entered into internal control signal generating section 34 and VDC supply circuit 35 together with control signal BASE_B from peripheral power supply circuit VDC (c) (FIG. 3). When peripheral power supply circuit VDC (b) becomes an auxiliary power supply, control signal BASE_B becomes low level after it becomes 40 ns high level. Consequently, internal control signal generating section 34 outputs signal BASED which becomes low level after it becomes 40 ns high level. Signal BASED is entered into reversing circuit 33. When reversing circuit 33 receives signal BASED, it outputs reversing signal ZICME to VDC supply circuit 35. VDC supply circuit 35 receives control signal BASE_B and ZICME. VDC supply circuit 35 supplies specified power VCCS as the auxiliary power supply based on the control of control signals BASE_B and ZICME. By the way, when VDC supply circuit 35 becomes the auxiliary power supply, the circuit is not subject to control of control signals ZICLE and ZICSE.

Control signal BASE outputted by VDC control circuit 31 is also entered to control signal generating section 32. Control signal generating section 32 transmits the output to peripheral power supply circuit VDC (c) as control signal BASE_C. Control signal BASE_C becomes a control signal of VDC supply circuit 35 when peripheral power supply circuit VDC (c) operates as auxiliary power supply. The description so far has been made with peripheral power supply circuit VDC (b) as an example. However, this also applies to peripheral power supply circuit VDC (c).

Figure 6:
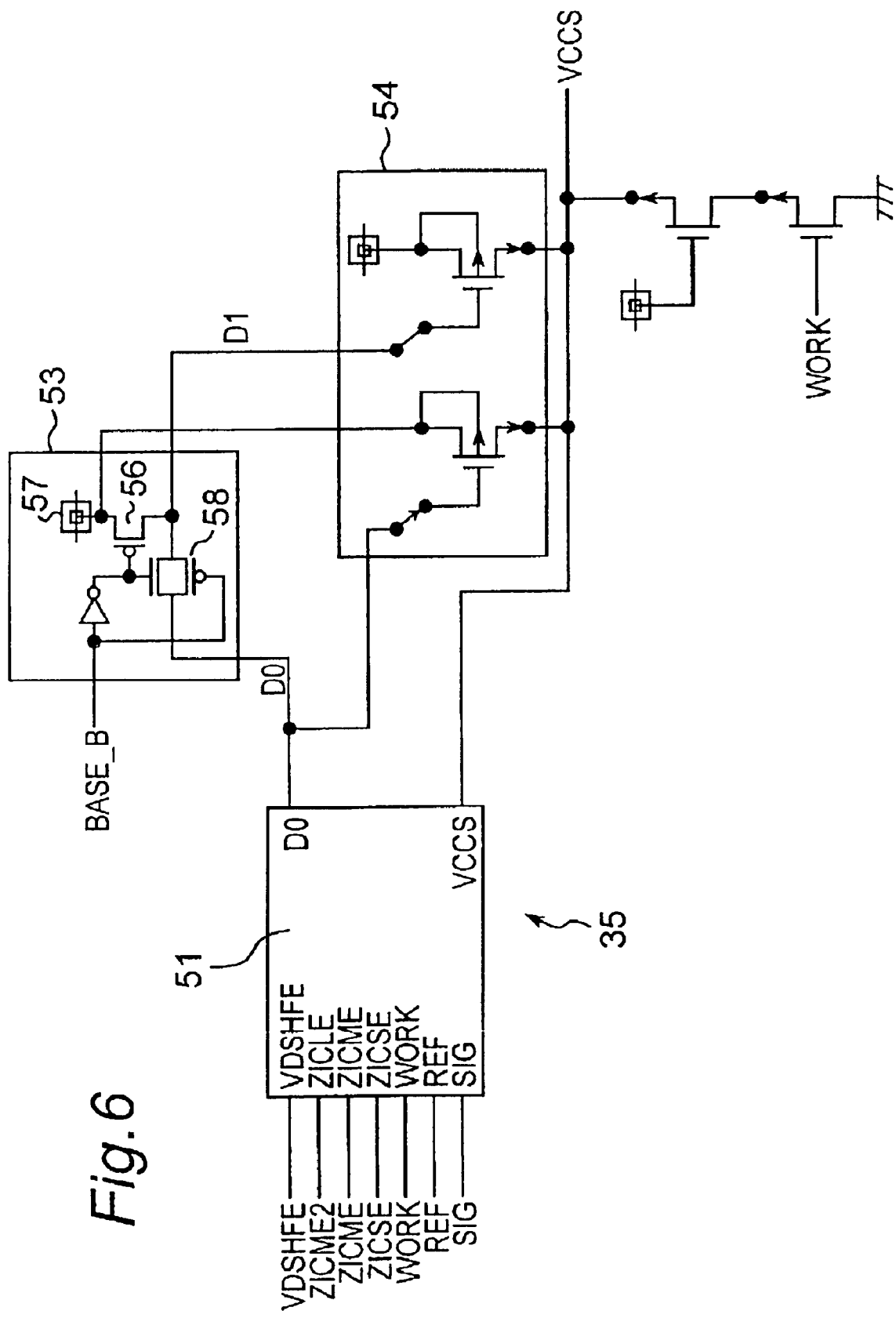
FIG. 6 is a block diagram of a configuration of a VDC supply circuit.
Figure 7:
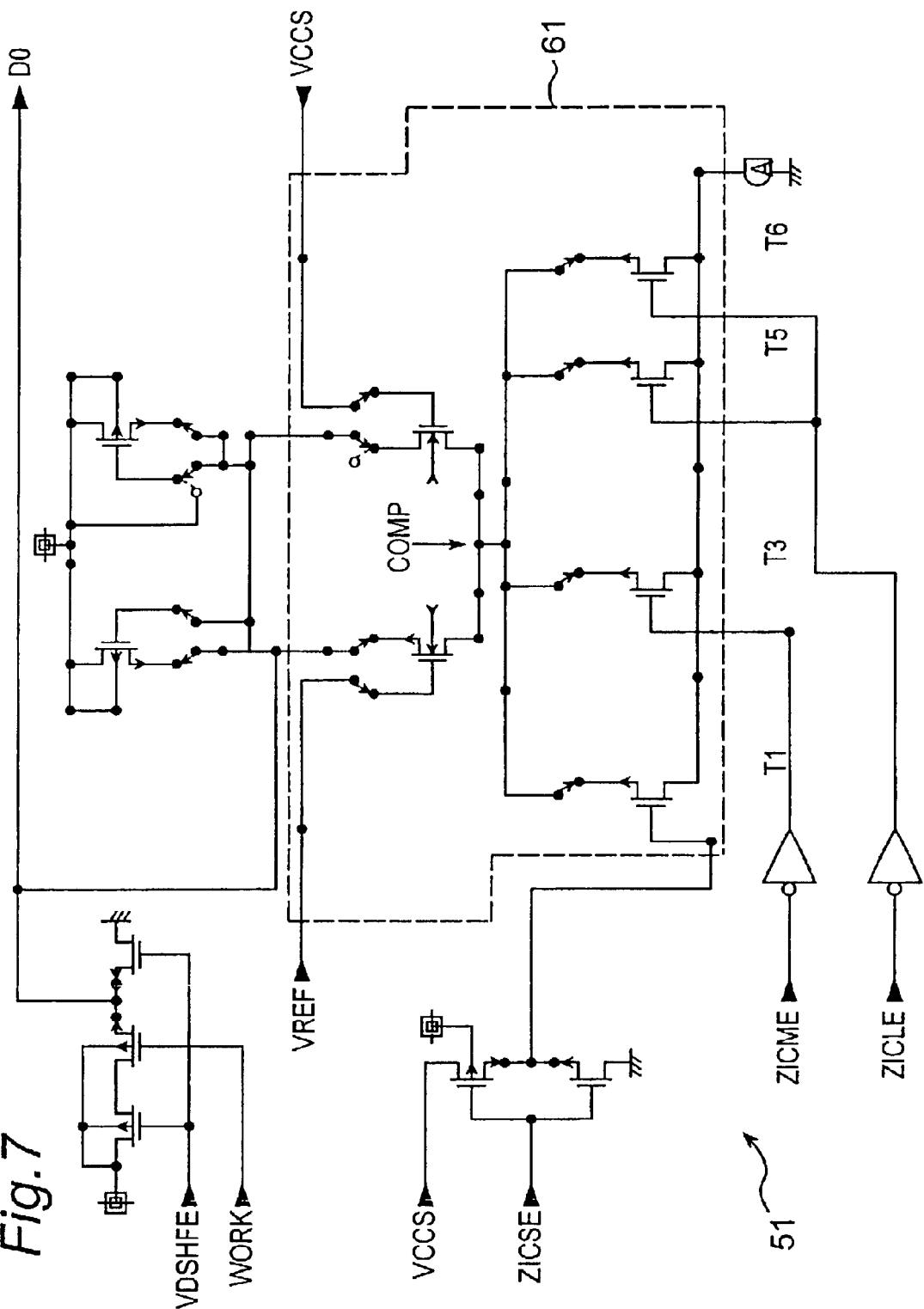
FIG. 7 is a circuit diagram of a VDC comparator.

Referring now to FIG. 6 and FIG. 7, the specific configuration of VDC supply circuit 35 will be described. FIG. 6 is a block diagram showing the configuration of VDC supply circuit 35. VDC supply circuit 35 primarily comprises VDC comparator 51, auxiliary power supply selecting circuit 53, and power supply driving circuit 54. VDC supply circuit 35 varies the current feed rate of power supply output VCCS in accordance with whether peripheral power supply circuit VDC is used for auxiliary power supply or not.

Now, description will be made on each component element of VDC supply circuit 35. VDC comparator 51 outputs analog signal D0 that determines the electric power feed rate in accordance with multiple control signals. The multiple control signals referred to here are primarily internal control signals ZICME, ZICLE, ZICSE outputted from reversing circuit 33 (FIG. 4). The comparison motion by VDC comparator 51 is carried out in accordance with these three internal signals. More detailed configuration and motions of VDC comparator 51 will be discussed later referring to FIG. 7.

Auxiliary power supply selecting circuit 53 outputs control signal D1 based on control signals BASED and D0. Control signal D1 is the signal that changes transistor size of output transistors of power supply driving circuit 54. To be more specific, when peripheral power supply circuit VDC serves as the main power supply, control signal BASE_B is of low level, and transistor 56 is turned off and switch 58 is turned on. Consequently, output signal D1 of auxiliary power supply selecting circuit 53 becomes same as signal D0. Power supply driving circuit 54 outputs electric power VCCS using transistors on both right and left as output drivers. On the other hand, when peripheral power supply circuit VDC becomes the auxiliary power supply, control signal BASE_B is of high level for 40 ns, and transistor 56 is turned on or switch 58 is turned off. Consequently, power supply driving circuit 54 outputs electric power VCCS using the transistor on the left side only.

Power supply driving circuit 54 has multiple transistors. One of the features of the present invention is that the output transistor size is reduced to improve response of power supply when peripheral power supply circuit VDC is utilized as the auxiliary power supply. Reducing the output transistor size means to reduce the number of transistors used, in other words, to reduce the number of transistors which are turned on.

In the figure, two transistors are used. Of these, the transistor on the left is constantly controlled by output signal D0. On the other hand, the transistor on the right is controlled by output signal D1. As described in relation to auxiliary power supply selecting circuit 53, when peripheral power supply circuit VDC serves as the main power supply, control signal D1 is same as control signal D0. That is, transistors on right and left operate with the same control signal. On the other hand, when peripheral power supply circuit VDC serves as the auxiliary power supply, control signal D1 is in free communication with fixed current source 57, and the transistor on the right of power supply driving circuit 54 is turned off. Accordingly, when peripheral power supply circuit 54 serves as the auxiliary power supply, the output transistor of power supply driving circuit 54 on the left side only is utilized. This can improve response of power supply.

Referring now to FIG. 7, VDC comparator 51 will be described. FIG. 7 is a circuit diagram showing the configuration of VDC comparator 51. VDC comparator 51 compares reference signal VREF with signal VCCS to be compared that indicates how much current is flowing, and outputs signal D0 in accord with the magnitude of the difference.

The power supply capabilities can be expressed by how much current is allowed to flow with a specified voltage maintained or how much current is allowed to flow without causing voltage drop. Peripheral power supply circuit VDC cannot maintain the voltage as it is when large current flows and voltage drop results. Consequently, VDC supply circuit 35 opens the gate of power supply driving circuit 54 by lowering voltage of signal D0 and operates to reinforce the electric power supplied. Accordingly, even when large current flows, voltage can be maintained without causing voltage drop.

Reference signal VREF is compared with signal VCCS to be compared by comparing section 61. That is, comparing section 61 carries out comparison operatons based on three internal control signals ZICME, ZICLE, ZICSE outputted from reversing circuit 33 (FIG. 4).

Comparison section 61 has transistors which are driven by each of three internal control signals ZICME, ZICLE, ZICSE. Transistor T1 is driven by signal VCCS outputted arising from control signal ZICSE. Transistor T3 is driven by control signal ZECME. Transistors T5, T6 are driven by control signal ZICLE. The advantages of providing transistors driven by each of these three signals lie in that the current comparison points can be varied.

When voltage drop occurs in VCCS to be compared, voltage of control signal D0 lowers and electric power supply to power supply output VCCS increases. When peripheral power supply circuit VDC is used for main power supply, signal COMP becomes 3-mA current by control of control signals ZICSE, ZICME, ZICLE. In addition, when peripheral power supply circuit VDC is used for auxiliary power supply, signal COMP becomes 1.4-mA current. That is, when it is used as auxiliary power supply, current consumption can be reduced.

When peripheral power supply circuit VDC is used for auxiliary power supply, drop of control signal D0 to voltage drop of VCCS to be compared delays from the case when it is used for main power supply. This is assumed to cause the response of power supply. However, because the response of power supply can be improved by reducing the number of power supply driving transistors driven by power supply driving circuit 54 (FIG. 6) as described above, in other words, by reducing the size of power driving transistor, the response of power supply will not be degrade, as a result.

Next description will be made on the control of bank power supply circuit VPP. Referring now again to FIG. 3, four bank power supply circuits VPP (w) through (z) provided in DRAM chip apply step-up voltage VPP which boosted power supply voltage supplied from outside to selected word lines (not illustrated). The reason why the step-up voltage is applied is to prevent loss of threshold voltage of access transistors contained in each memory cell of DRAM and to write the data of line voltage level successfully in a capacitor. The step-up voltage can be obtained by charge-pump operations utilizing the known charge-pump circuit (not illustrated) provided in bank power supply circuit VPP.

Constantly driving all the bank power supply circuits VPP (w) through (z) can simplify the control, but on the other hand, power consumption increases. Therefore, driving the required bank power supply circuit VPP only can suppress power consumption. The selective drive of bank power supply circuit VPP can be achieved by utilizing control signal RASD <3:0>.

For example, when memory bank D is activated, bank power supply circuit VPP (w) is activated by control signal RASD <3>. In such event, bank power supply circuits VPP (x) through (z) are not activated. In other example, when memory bank B is activated, bank power supply circuits VPP (x) and VPP (y) are activated. In such event, bank power supply circuits VPP (w) and VPP (z) are not activated. This applies when other memory banks A, D are activated.

Referring now again to FIG. 2, in the present embodiment, electric power supplied by bank power supply circuit VPP is varied in accord with the position of bank power supply circuit VPP. The power supply capabilities of bank power supply circuits VPP (w), (z) are greater than the power supply capabilities of bank power supply circuit VPP (x), (y). Specifically, they are about double. The reason is that bank power supply circuits VPP (w), (z) must drive two adjacent memory bank arrays D1, D2 and memory bank arrays A, A2, respectively. Bank power supply circuits VPP (x), (y) may drive either memory bank array B2 or B1. Or they may drive either memory bank array C2 or C1. It is possible to equalize influences of signal change operation (for example, heat generation) by supplying electric power from bank power supply circuits VPP at opposite angles of central region, and the memory can be stably operated.

The magnitude of the electric power supplied by bank power supply circuit VPP can be adjusted by the number of pump units of charge pump circuit (not illustrated) in bank power supply circuit VPP. For example, to bank power supply circuits VPP (w), (z) that require large step-up voltage, four pump units are installed, while to bank power supply circuits VPP (x), (y), two pump units are installed. The pump unit operates in accordance with control signal RASD <3:0> that determines whether bank power supply circuit VPP is activated or not.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor storage unit comprising:
   multiple arrays that form memory banks on a substrate, each of the memory banks consisting of two of the multiple arrays;
   first power supplies, each of which supplies driving power to a peripheral circuit which drives each of the multiple arrays; and
   second power supplies, each of which supplies access power to word lines which access the multiple arrays, wherein multiple arrays are arranged in the form of a matrix and surround the central region of the substrate,
   wherein the first power supplies are mounted to a central region side and to an opposite side of the central region side for predetermined arrays, wherein the second power supplies are arranged at four corners of the central region, and wherein the first power supplies serve as a main power supply to provide main power and as an auxiliary power supply to provide auxiliary power, smaller than the main power, and provide distantly arranged two of the multiple arrays forming a memory bank with power.

2. The semiconductor storage unit according to claim 1, wherein each of the first power supplies comprises multiple output transistors that adjusts output power, wherein the main power supply outputs an activation signal to activate as the auxiliary power supply, and wherein a power supply receives the activation signal from the main power supply to serve as the auxiliary power supply by adjusting the number of transistors to which current is allowed to flow according to the activation signal.

3. The semiconductor storage unit according to claim 2, wherein each of the first power supplies further comprises a comparator that compares a first signal indicating a current flow rate with a reference second signal to obtain a difference and to decide an output power based on the difference and the activation signal, and wherein the current flow rate to flow the comparator of the auxiliary power supply is approximately one half the current flow rate of the comparator of the main power supply.

4. The semiconductor storage unit according to claim 1, wherein one of the second power supplies supply the power to word lines that access adjacently arranged two of the multiple arrays that form a memory bank, and wherein two of the second power supplies supply the power to word lines that access distantly arranged two of the multiple arrays that form a memory bank.

5. The semiconductor storage unit according to claim 4, wherein each power supplied from each of the two of the second power supplies is smaller than that supplied from the one of the second power supplies.

6. The semiconductor storage unit according to claim 4, wherein the two of the second power supplies are arranged at corners of the central region with diagonal relationship.

7. The semiconductor storage unit according to claim 1, wherein the second power supplies operates according to a control signal created from the activation signal.

* * * * *